(12) United States Patent
Watanabe et al.

(10) Patent No.: US 6,714,571 B2
(45) Date of Patent: Mar. 30, 2004

(54) RIDGE TYPE SEMICONDUCTOR LASER OF DISTRIBUTED FEEDBACK

(75) Inventors: Yoshiaki Watanabe, Tsurugashima (JP); Nong Chen, Tsurugashima (JP); Kiyoshi Takei, Tsurugashima (JP); Kiyofumi Chikuma, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/819,370

(22) Filed: Mar. 28, 2001

(65) Prior Publication Data

US 2001/0036213 A1 Nov. 1, 2001

(30) Foreign Application Priority Data

Mar. 29, 2000 (JP) ........................................ 2000-091734

(51) Int. Cl.[7] .................................................. H01S 5/00
(52) U.S. Cl. .............................. 372/45; 372/43; 372/44; 372/46
(58) Field of Search ..................................... 372/43–50

(56) References Cited

U.S. PATENT DOCUMENTS

| | | | |
|---|---|---|---|
| 4,761,791 A | * | 8/1988 | Stegmuller ..................... 372/46 |
| 4,805,184 A | * | 2/1989 | Fiddyment et al. ............. 372/95 |
| 5,982,804 A | * | 11/1999 | Chen et al. ..................... 372/96 |

FOREIGN PATENT DOCUMENTS

| | | | | |
|---|---|---|---|---|
| JP | 62237427 A | * | 10/1987 | ........... G02F/1/133 |
| JP | 405021889 A | * | 1/1993 | ............. H01S/3/18 |

OTHER PUBLICATIONS

C.H. Chen et al, "Coupling coefficients of gain–coupled distributed feedback lasers with absorptive grating", Electronics Letters, vol. 32, No. 14, pp. 1288–1290 (1996).*

"An Asymmetric Cladding Gain–Coupled DFB Laser with Oxide Defined Metal Surface Grating by MOCVD", Osowski et al., IEEE Photonics Technology Letters, vol. 9, No. 11, 1997, pp. 1460–1462.

* cited by examiner

Primary Examiner—Nathan J. Flynn
Assistant Examiner—Johannes P. Mondt
(74) Attorney, Agent, or Firm—Perman & Green, LLP (57) ABSTRACT

A semiconductor laser includes an active layer made of semiconductor; a ridge stripe having a cladding layer formed on the active layer and a contact layer formed on the cladding layer to protrude from the active layer; a pair of gratings each having a periodic structure in a longitudinal direction of the ridge stripe having a plurality of grooves each extending from side walls of the ridge stripe on flat portions in both sides of the ridge stripe; and absorbing layers covering the surfaces of the grooves of gratings to absorb excited light.

11 Claims, 7 Drawing Sheets

RIDGE TYPE SEMICONDUCTOR LASER OF DISTRIBUTED FEEDBACK

BACKGROUND OF THE INVENTION

1. Field of the Invention

The present invention relates to a distributed feedback (DFB) type semiconductor laser and, more particularly, to a ridge type semiconductor laser of laterally-coupled distributed feedback (LC-DFB).

2. Description of the Related Art

The DFB semiconductor lasers are known as a semiconductor device which has a periodic structure i.e., grating in one direction in which induced laser beam propagate to improve the coupling of forward and backward waves to utilize for wave-selectivity in the optical feedback. The DFB semiconductor lasers include a distributed Bragg reflection type semiconductor laser. The DFB semiconductor laser is used for a light source in a pickup device mounted on an optical apparatus for recording and reproducing reading out and writing information signals on an optical disc. The DFB lasers are also used in the fields of optical communication systems such as optical CATVs, optical measurement and the like.

The DFB semiconductor laser requires a grating having a periodic structure adjacent to the active region to improve the optical coupling. In the manufacture of the DFB semiconductor lasers, therefore, it requires to use two or more steps of epitaxial growth i.e., re-growth step. In the process of conventional re-growth step, a laser structure is grown by means of the metal organic chemical vapor deposition (MOCVD), then the grating is formed in the laser structure layer by etching, and thereafter another laser structure is formed on the grating again by the MOCVD.

Recently, in order to avoid such a complicated epitaxial re-growth, the so-called single-growth DFB semiconductor lasers have been suggested which are fabricated using one single step of epitaxial growth. For example, there is a gain coupled DFB semiconductor laser which has an asymmetrical cladding waveguide structure (M. L. Osowski, J. S. Hughes, R. M. Lammert, and J. J. Coleman "An Asymmetric Cladding Gain-Coupled DFB Laser with Oxide Defined Metal Surface Grating by MOCVD" IEEE Photonics Technology Letters, Vol. 9, No. 11, November 1997 P1460-P1462).

Figure 1:
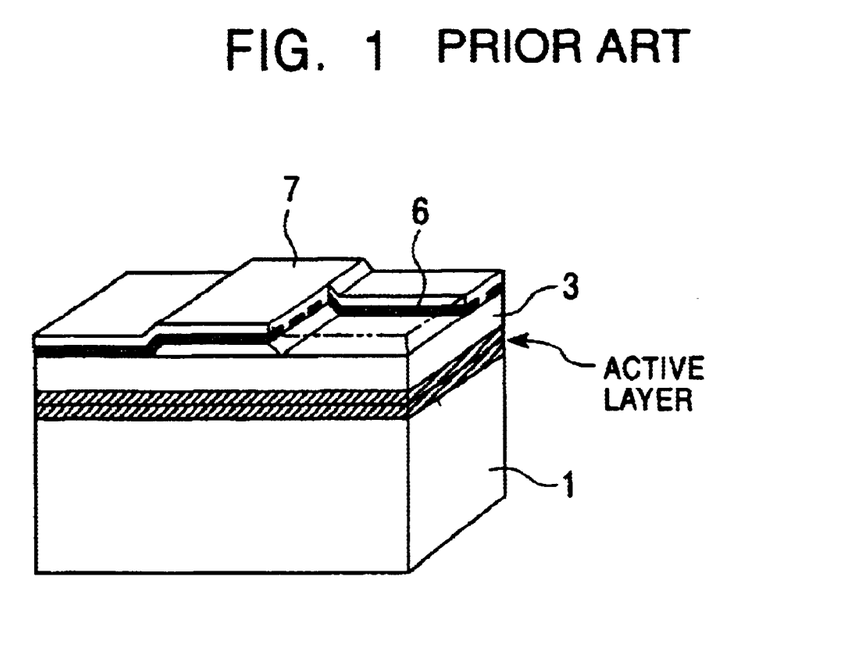
FIG. 1 is a schematic perspective view showing a DFB semiconductor laser partially lacked.

As shown in FIG. 1, a gain coupled DFB semiconductor laser has an active layer 2a, an upper cladding layer 3 and a lower cladding layer 1 sandwiching the active layer 2, plurality of $SiO_2$ insulators 6 formed on the upper cladding layer 3 with a cap stripe, and a metal electrode layer 7 of Ti—Pt—Au completely covering the insulators and the cladding layer, in characterized in that the upper cladding layer 3 is formed thinner than the lower cladding layer 1 whereby the light intensity distribution becomes asymmetrical in a direction perpendicular to the longitudinal direction of waveguide. In such a ridge gain coupled DFB semiconductor laser, the excited light of laser leaks from the thinner upper cladding layer 3 in the grating region, because the thinner upper cladding layer 3 has poor absorption in the GaAs semiconductor laser. Therefore, the excited light of laser is moderated by the metal electrode layer 7 at the side of the thinner upper cladding layer 3 of top surface and laser-oscillated in a single axis mode.

When such a surface grating type gain coupled DFB semiconductor laser is manufactured with using InGaAs material, the property satisfied for the slope efficiency is not obtained.

SUMMARY OF THE INVENTION

The present invention confronts the above-described problem, and it is an object of the present invention to provide a laterally-coupled DFB semiconductor laser secure having complex coupling of index and gain couplings.

The object is achieved by a ridge type semiconductor laser of laterally-coupled distributed feedback in a first aspect of the invention comprises;

an active layer made of semiconductor;

a ridge stripe having a cladding layer formed on said active layer and a contact layer formed on the cladding layer to protrude from said active layer;

a pair of gratings each having a periodic structure in a longitudinal direction of the ridge stripe having a plurality of grooves each extending from side walls of the ridge stripe on flat portions in both sides of the ridge stripe; and absorbing layers covering the surfaces of the grooves of gratings to absorb excited light.

In a second aspect of a semiconductor laser according to the invention, said absorbing layer comprises a first insulator kept contact with the surfaces of the grooves of gratings; a metal layer contiguously formed on the first insulator; and a second insulator contiguously formed on the metal layer.

In a third aspect of a semiconductor laser according to the invention, said absorbing layer is an insulator layer comprising an insulator material as a matrix and metal particles dispersed in the matrix.

In a fourth aspect of according to the invention, the semiconductor laser further comprises bracket grating portions each having a slope surface extending from a flat top portion of the ridge stripe to a top face of a land portion defined by the adjacent grooves and coupling the side walls of the ridge stripe and the gratings.

In a fifth aspect of a semiconductor laser according to the invention, said active layer is a bulk layer, a single quantum well layer, or a multiple quantum well layer mainly composed of $In_{1-x}Ga_xAs_{1-y}P_y$ (where $0 \leq x < 1, 0 \leq y \leq 1$); and said cladding layer is made of InP.

In a sixth aspect of a semiconductor laser according to the invention, said contact layer is made of InGaAsP or InGaAs.

In a seventh aspect of a semiconductor laser according to the invention, the ridge stripe and the pair of gratings have a relationship between a waveguide without grating up and down and gratings laterally coupled thereto.

DETAILED DESCRIPTION OF PREFERRED EMBODIMENTS

A description for the invention will now be made with reference to accompanying drawings.

Figure 2:
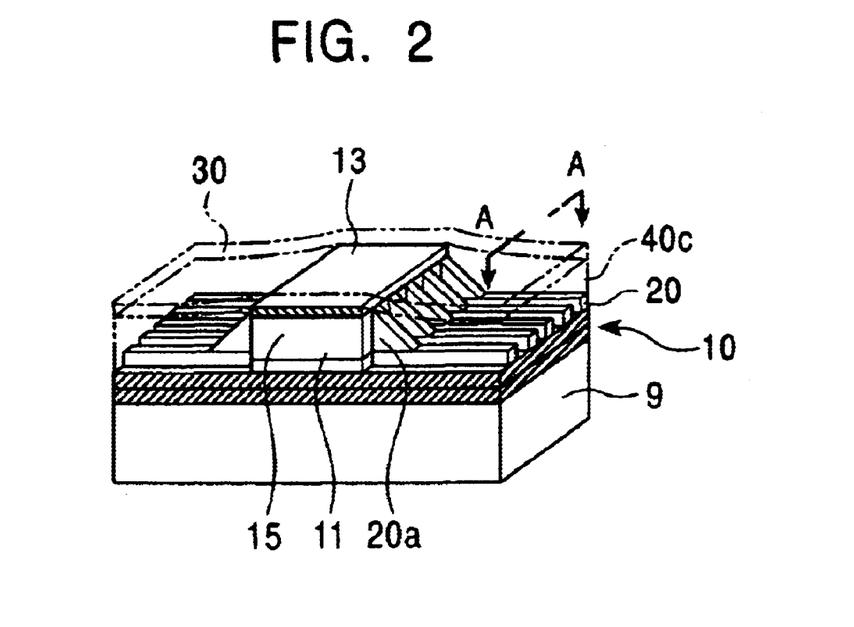
FIG. 2 is a schematic perspective view showing a DFB semiconductor laser partially lacked of an embodiment according to the invention.

FIG. 2 shows a laterally-coupled DFB ridge semiconductor laser of InGaAsP/InP. The semiconductor laser comprises an active layer 10 made of semiconductor and a ridge stripe 15. The ridge stripe includes a cladding layer 11 formed on the active layer 10 and a contact layer 13 formed on the cladding layer 11 to protrude from the active layer 10. The semiconductor laser also includes a pair of gratings 20 each having a periodic structure in a longitudinal direction of the ridge stripe 15. Each grating 20 is provided with a plurality of grooves each extending from side walls of the ridge stripe 15 on flat portions in both sides of the ridge stripe.

Figure 3:
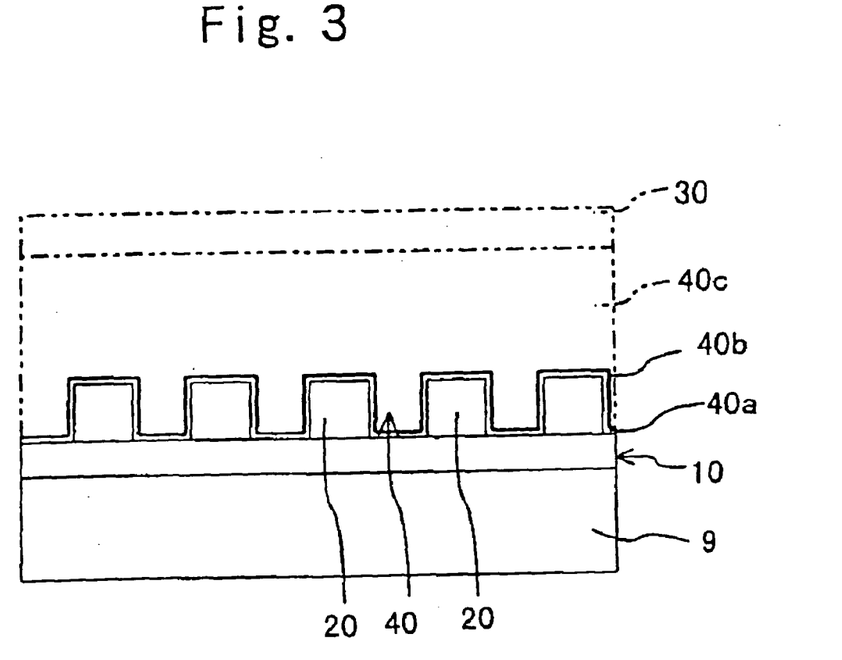
FIG. 3 is a partially enlarged cross-sectional view taken along the line AA shown in FIG. 2.

In addition, the semiconductor laser includes absorbing layers 40 covering the surfaces of the grooves of gratings 20 to absorb excited light therein as shown in FIG. 3. The absorbing layer 40 includes a first insulator 40a kept contact with the surfaces of the grooves of gratings 20, a metal layer 40b contiguously formed on the first insulator, and a second insulator 40c contiguously formed on the metal layer.

Figure 4:
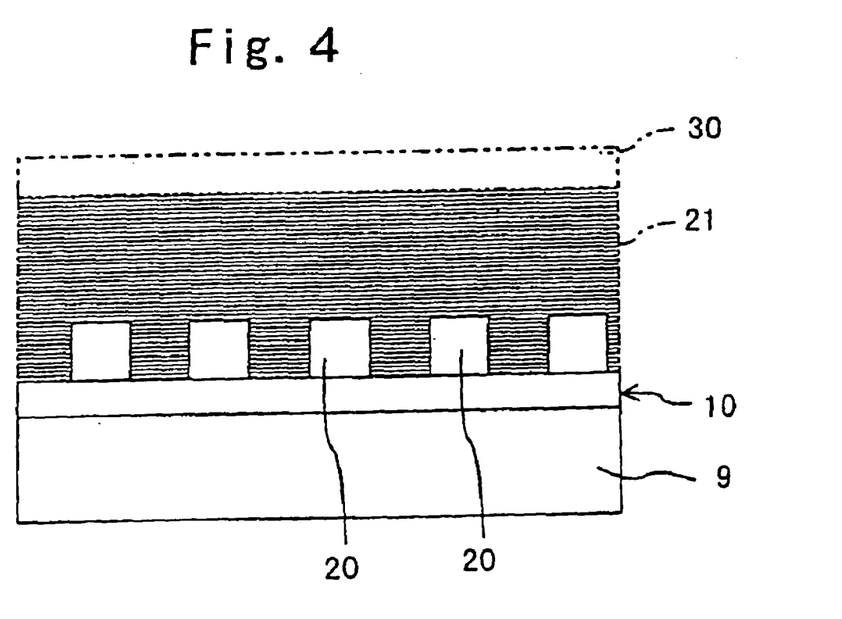
FIG. 4 is a partially enlarged cross-sectional view showing a DFB semiconductor laser of another embodiment according to the invention.

As shown in FIG. 4, the absorbing layer 40 may be an insulator layer comprising an insulator material 21 as a matrix and metal particles (not shown) dispersed in the matrix in another embodiment of the invention.

The semiconductor laser is provided with bracket grating portions 20a each having a slope surface extending from a flat top portion of the ridge stripe to a top face of a land portion defined by the adjacent grooves and coupling the side walls of the ridge stripe 15 and the gratings 20 as shown in FIG. 2.

In the structure of DFB semiconductor laser of the embodiment, the optical coupling between the grating and guided light in the ridge stripe is mainly subject to the index coupling therebetween. On the other hand, since the width of the active layer region into which electrical current is injected is modulated by the grating, it implies that such a region generating an optical gain is modulated by the grating. Therefore, the DFB semiconductor laser also demonstrates the function of the gain coupling.

Accordingly, the optical coupling between the grating and guided light in the ridge stripe is a combination optical coupling consisting of index coupling and the gain coupling in the ridge type semiconductor laser of laterally-coupled distributed feedback according to the present invention.

description for the invention will now be made with reference to accompanying drawings.

The manufacture of the laterally-coupled DFB ridge semiconductor laser of InGaAsP/InP by means of MOCVD using a gas of an organometallic compound gas will be described.

<1. Film Fabrication on a Substrate>

Figure 5:
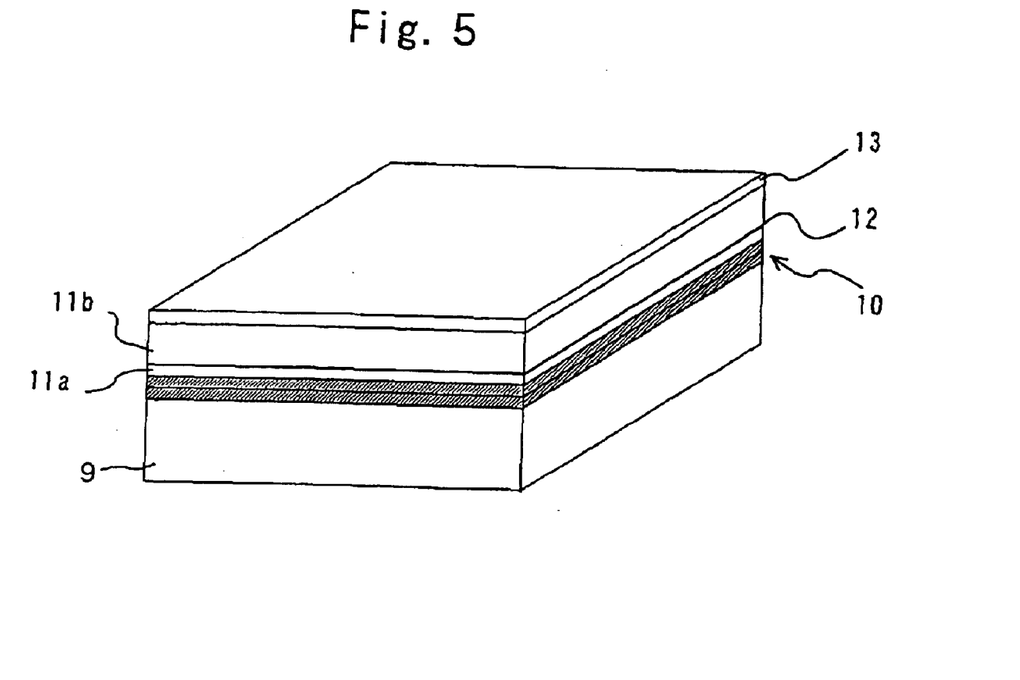
FIGS. 5 to 9 are schematic perspective views each showing a substrate of a laser at a step of manufacturing a DFB semiconductor laser of an embodiment according to the invention.

As shown in FIG. 5, there is first prepared a wafer of a n-InP crystalline substrate 9 having a predetermined plane orientation (100). To clean the surface of the wafer a chemical etching is performed. After that, a first guide layer, a guide layer and a second guide layer which have $In_{1-x}Ga_xAs_{1-y}P_y$ (where $0 \leq x < 1$, $0 \leq y \leq 1$) respectively are formed on the cleaned surface of the wafer 9 to fabricate an SCH (separate confinement heterostructure) active layer region 10 of semiconductor structure, by using MOCVD. Namely, the active layer 10 may be a bulk layer, a single quantum well layer, or a multiple quantum well layer which is mainly composed of $In_{1-x}Ga_xAs_{1-y}P_y$ (where $0 \leq x < 1$, $0 \leq y \leq 1$).

Next, a first cladding layer 11a made of a material for a ridge stripe such as p-InP is deposited on the active layer 10.

After that, a wet-etching termination layer 12 made of p-InGaAsP or p-InGaAs for terminating a wet-etching is deposited on the cladding layer 11a.

Next, a second cladding layer 11b made of a material for a ridge stripe such as p-InP is also deposited on the wet-etching termination layer 12 and then a contact layer 13 made of p-InGaAs is deposited on the cladding layer 11b.

Thus, a laser substrate having a laser structure is formed as shown in FIG. 5. Instead of MOCVD, the laser structure may be formed a predetermined processes such as epitaxial growth, liquid phase epitaxial growth, metal organic chemical vapor deposition, molecular beam epitaxial growth.

<2. Fabrication of a Ridge Stripe>

Figure 6:
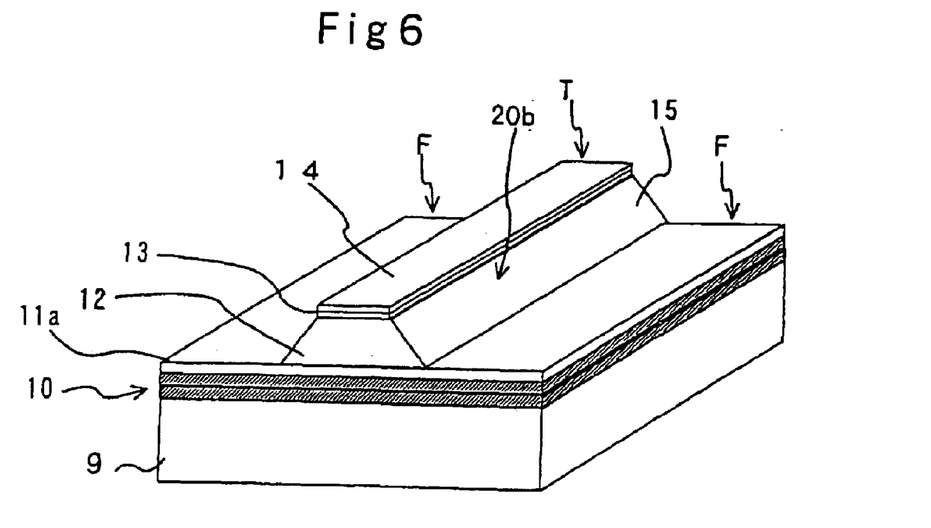

A ridge of semiconductor is processed from the cladding layer 11b in such a manner that a $SiO_2$ film is patterned with a stripe by means of the photolithography using a photoresist as shown in FIG. 6. First, a stripe mask 14 made of $SiO_2$ with a predetermined width is formed on the contact layer 13 so as to provide a ridge stripe which extends in a predetermined direction e.g., a <0–11> direction of the laser substrate. After that, the contact layer 13 is dry-etched up to the interface of the cladding layer 11b.

Next, the cladding layer 11b of a ridge stripe material is wet-etched to form two side flat portions F and a ridge stripe 15 protruding therefrom to a predetermined height and having a flat top portion T, as shown in FIG. 6. The ridge stripe 15 has the side walls 20b of crystalline plane (111) each having gently down at a slope angle of 0–55° to both the flat portions F.

<3. Patterning of Grating Mask by the Electron Beam Lithography>

Figure 7:
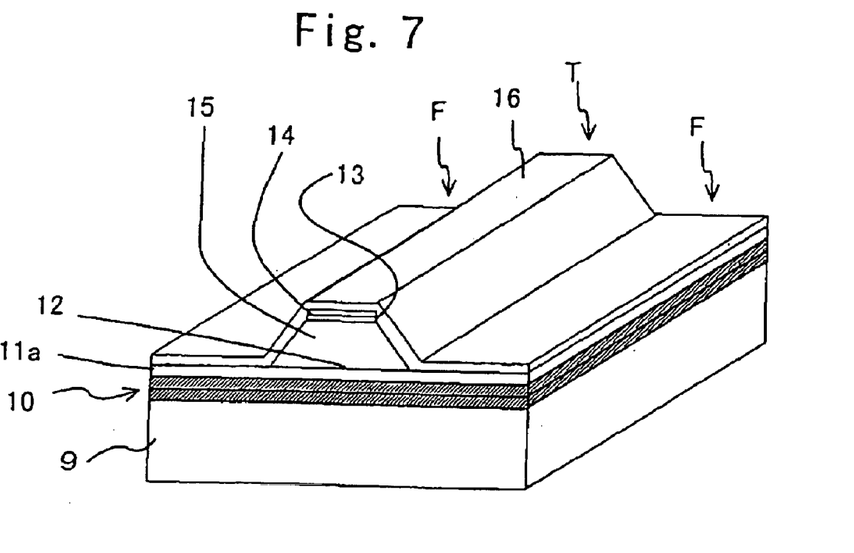

Next, as shown in FIG. 7, a protective film 16 made of $SiO_2$ or the like is formed by the sputtering method or the like in such a manner that the film is spread over the two flat portions F of the first cladding layer 11a and the flat top portion T of the ridge stripe 15.

Next, the protective film 16 is coated with a resist fluid for electron beam (EB) writing that extends in the regions of both lateral flat portions F and the flat top portion T, by a spin coating. Thereafter, baking is performed to form a cured resist layer.

Figure 8:
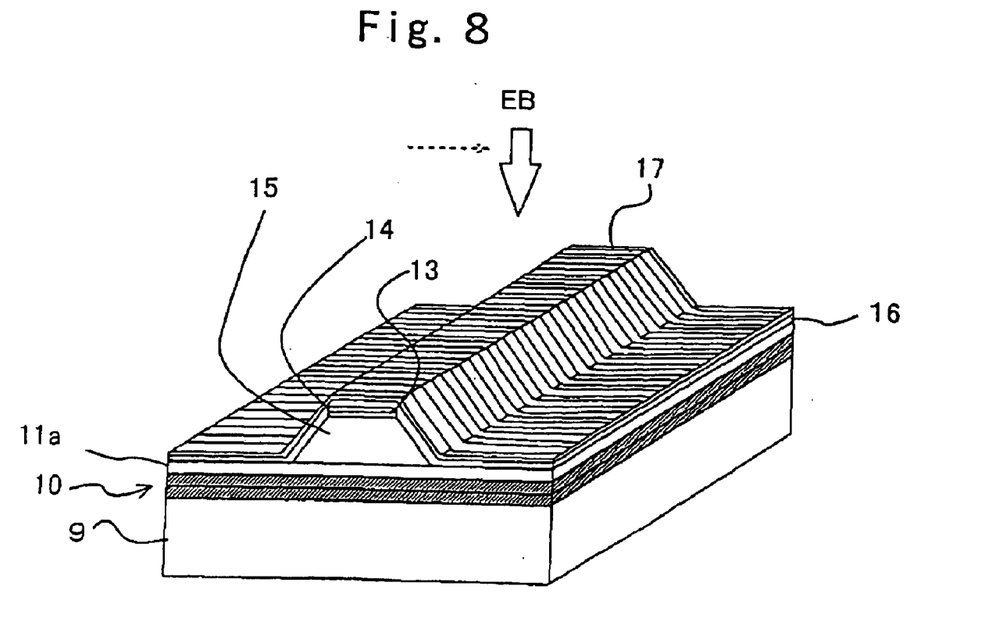

Then, as shown in FIG. 8, the EB writing process is performed on the entire surface of the resist layer 17 including the top portion of the ridge stripe to provide lines which periodically extend in the crystal orientation direction in accordance with a desired oscillation frequency of the laser, thereby forming a latent image of a grating mask in a periodic structure which undergoes a variation of shape having a period Λ in the direction in which the ridge stripe extends, on the resist layer 17.

Next, the development of the latent image of grating mask is carried out and then the grating mask 18 is formed on the protective film 16.

<4. Fabrication of Grating>

A step of forming a grating is carried out in which lines of the grating are transferred through openings of the grating mask to the $SiO_2$ protective film 16 by means of dry etching using $CF_4$ gas so that the both lateral flat portions of the first cladding layer 11a are selectively etched to transform partially the first cladding layer into a grating 20. In other words, a plurality of grooves are dug in the cladding layer 11a of flat portions to define land portions of the grating 20. By the etching, vertical side walls and root shape of ridge stripe 15 are securely formed.

Figure 9:
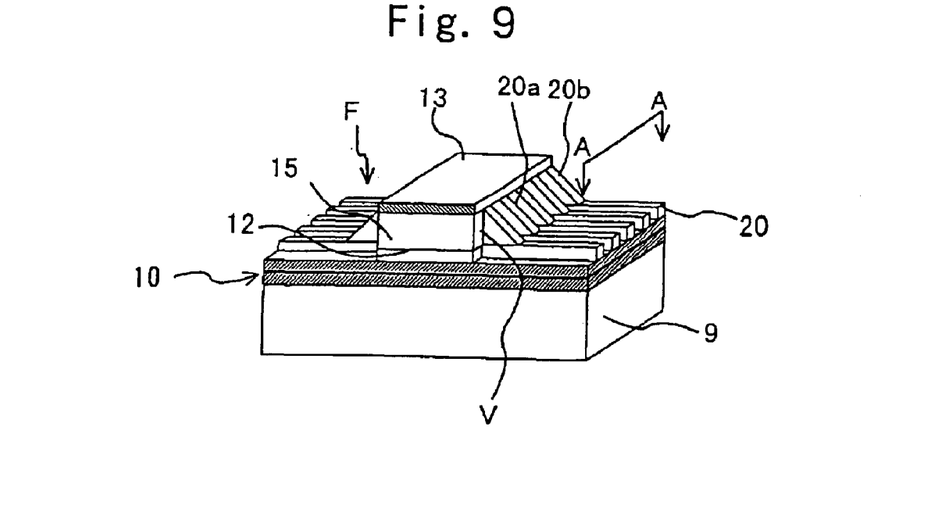

After that, the protective film 16 is wet-etched and removed by using a hydrochloric acid type etchant, as shown in FIG. 9. As a result, a ridge semiconductor laser structure is formed in which each of bracket grating portions 20a has the slope surface 20b extending from the flat top portion of ridge stripe 15 to the top face of land portion defined by the adjacent grooves and coupling the side walls of the ridge stripe 15 and the gratings 20.

In the dry-etching process, the contact layer 13 disposed on the flat top portion T of the ridge stripe is not etched by the dry-etching and survives the dry-etching, because the total thickness of the lamination composed of both the stripe mask 14 and the protective film 16 disposed on the flat top portion T of the ridge stripe is grater than the thickness of the protective film 16 disposed on the flat portions F of the first cladding layer.

By performing a two step etching process consisting of dry and wet etchings, the crystalline plane (011) as a vertical side appears at the side walls of the ridge and the crystalline plane (01-1) as a vertical side appears at the protruding side walls of the grating lands, the gentle slope side walls 20b of the ridge 15 and both the flat portions F of the first cladding layer are dry-etched via the mask so that deep valleys are dug each having a vertical side wall V standing up in about vertical which define the side wall of the ridge stripe 15. As a result, a very deep grating up to the side wall of the ridge stripe is formed so that a high optical coupling coefficient between the grating and guided light in the ridge stripe is achieved.

<5. Burying with Insulator and Fabrication of Electrodes>

Figure 10:
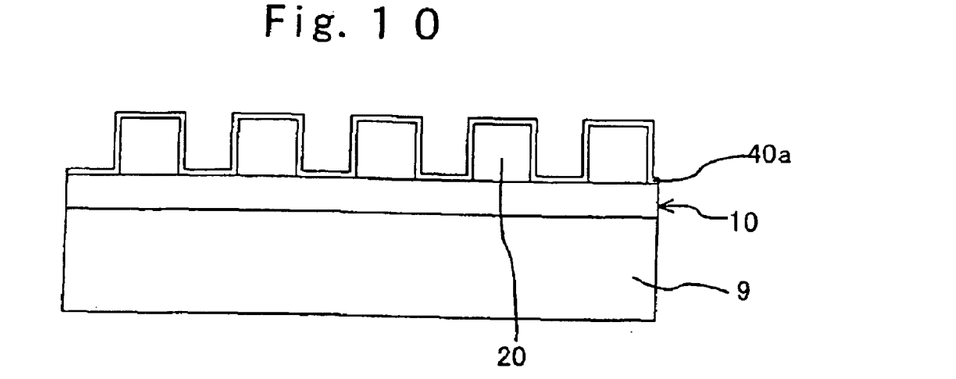
FIGS. 10 and 11 are partially enlarged cross-sectional views each taken along the line AA shown in FIG. 9.

Only the contact layer 13 disposed on the flat top portion of the ridge stripe is covered with a protective film. As shown in FIG. 10, first insulators 40a such as $SiO_2$ or the like are formed by the sputtering method or the like so as to completely cover the surfaces of the grooves of gratings 20.

Figure 11:
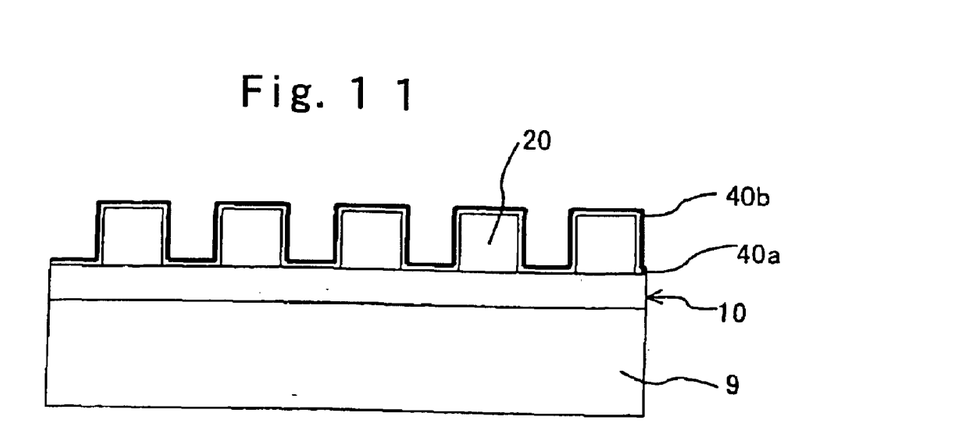

Next, as shown in FIG. 11, a metal layer 40b is contiguously formed on the first insulator 40a by the sputtering method or the like so as to completely cover the surfaces of first insulator 40a. The material of metal layer 40b is selected a group consisting of metals having a pertinent absorption coefficient to an excited light of laser.

Figure 12:
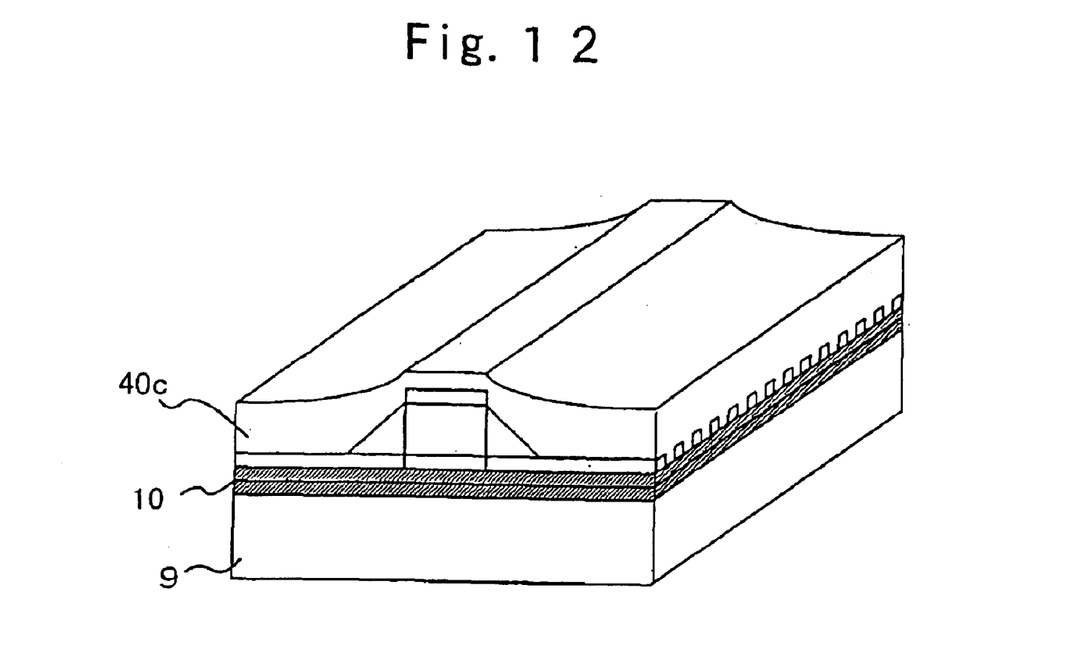
FIGS. 12 to 14 are schematic perspective views each showing a substrate of a laser at a step of manufacturing a DFB semiconductor laser of an embodiment according to the invention.

After that, a second insulator layer 40c is formed on the metal layer 40b of gratings 20 and the ridge stripe 15 as shown in FIG. 12. The material of second insulator layer 40c may be selected from dielectrics, a silicon compound such as Spin-On-Glass, resin such as polyimide or the like not to absorb the excited light of laser. This material is applied in a fluid state to the entire region where the ridge stripe 15 and grating 20 and cured. The second insulator layer 40c for blocking electrical current is formed thinner on the flat top portion of the ridge stripe than on the top portion of the grating 20.

In addition to the embodiment shown in FIGS. 10 to 12 which utilizes a lamination of multi-layer of metal/dielectric, only a single-layer of the second insulator layer 40c containing metal particles dispersed therein may be used as another embodiment. The single-layer second insulator layer 40c made of Spin-On-Glass is doped with a pertinent quantity of metal particles.

Figure 13:
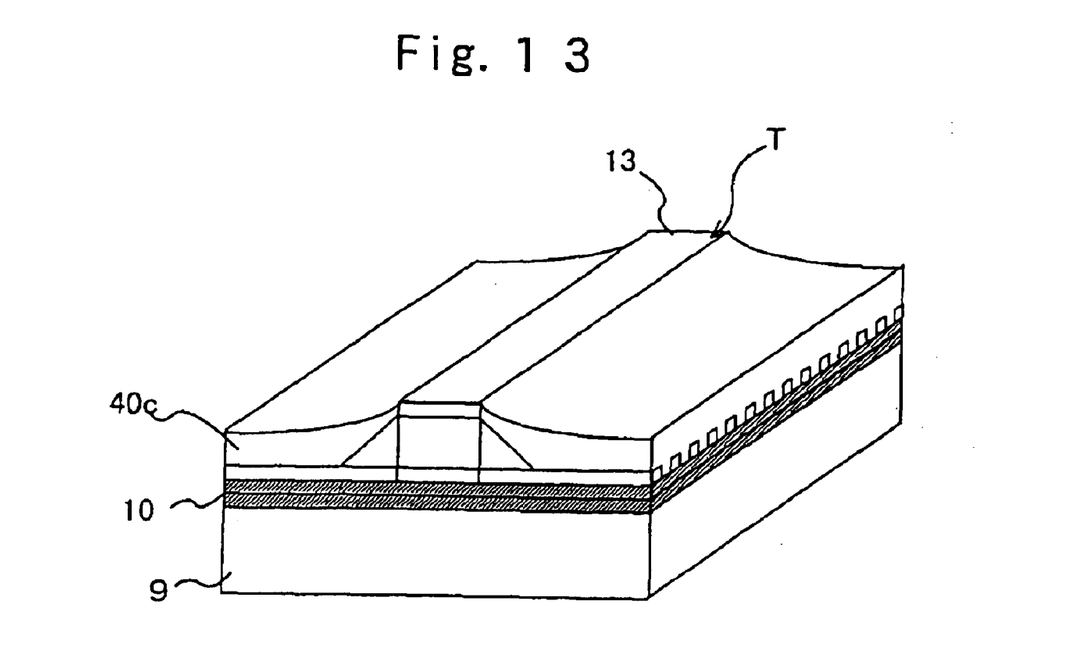

Thereafter, as shown in FIG. 13, the second insulator layer 40c is partly removed until the top portion of the ridge stripe 15 is exposed. It is possible to expose only the flat top portion T of the ridge stripe 15 by performing dry etching where there is a difference between the thicknesses of the second insulator layer 40c on the flat top portion of the ridge stripe and on the top portion of the grating 20. This is the formation of an electrode window using the so-called self-alignment process.

Figure 14:
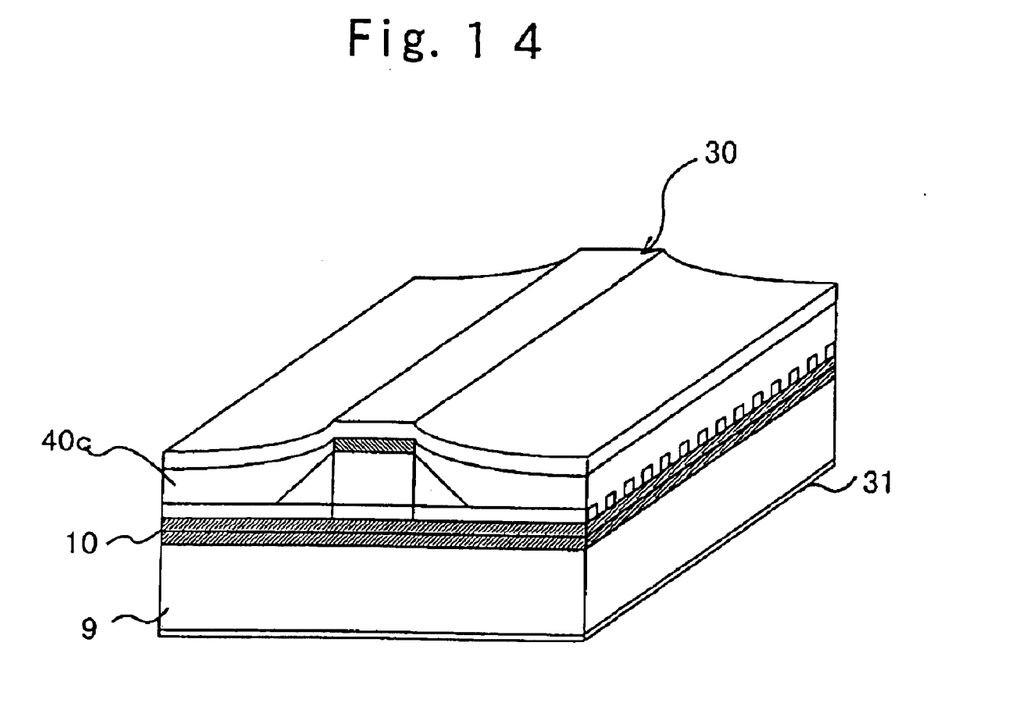

Next, as shown in FIG. 14, an electrode 30 is formed on the contact layer at the top portion T of the ridge stripe thus exposed. The ridge stripe top portion T is flat because there is no grating. It is therefore possible to form an electrode free from poor contact. Further, an opposite electrode 31 is formed on the opposite surface of the substrate 9 of n-InP. An ohmic contact metal having no rectifying property is chosen for those electrodes. In general, AuGeNi and CrAu electrodes are formed using vacuum deposition on the n-type and p-type sides, respectively. In this way, predetermined steps including burying the ridge with the insulator and fabricating electrodes on the n-type and p-type sides are performed to complete the a ridge type semiconductor laser of laterally-coupled distributed feedback.

As described above, according to the present embodiment, the laterally coupled DFB semiconductor laser having a ridge waveguide and gratings formed at the both side of the waveguide, whereby the optical coupling between the guided light and evanescent wave is achieved widely to generate a single wavelength oscillation. Thus the optical coupling between the gratings and generated light is obtained as an index and gain (or loss) coupling.

A gain (or loss) coupled DFB semiconductor laser has a good durablity against a returning light from the connected optical fiber in comparison with an index coupled DFB semiconductor laser. The returning light causes noise and reduction of single mode yield. Since the invention employs gratings with the absorbing layer made of an assimilating material to be loss gratings which moderates optical loss along the waveguide, whereby loss coupled DFB semiconductor laser is obtained. As a result, the invention achieves a laterally-coupled gratings with the waveguide and the high yield of the gain (loss) coupled DFB semiconductor laser is enlarged with a low cost.

What is claimed is:

1. A semiconductor laser comprising:

an active layer made of semiconductor:

a ridge stripe having a cladding layer formed on said active layer and a contact layer formed on the cladding layer to protrude from said active layer;

a pair of gratings each having a periodic structure in a longitudinal direction of the ridge stripe having a plurality of grooves each extending from side walls of the ridge stripe on flat portions in both sides of the ridge stripe; and absorbing layers covering both surfaces of the grooves of gratings to absorb excited light;

wherein each of said absorbing layers comprises a first insulator kept contact with the surfaces of the grooves of gratings; a metal layer contiguously formed on the first insulator; and a second insulator contiguously formed on the metal layer.

2. A semiconductor laser comprising:

an active layer made of semiconductor:

a ridge stripe having a cladding layer formed on said active layer and a contact layer formed on the cladding layer to protrude from said active layer;

a pair of gratings each having a periodic structure in a longitudinal direction of the ridge stripe having a plurality of grooves each extending from side walls of the ridge stripe on flat portions in both sides of the ridge strips; and absorbing layers covering both surfaces of the grooves of gratings to absorb excited light;

wherein each of said absorbing layers is an insulator layer comprising an insulator material as a matrix and metal particles dispersed in the matrix.

3. A semiconductor laser according to claim 1, further comprising bracket grating portions each having a slope surface extending from a flat top portion of the ridge stripe to a top face of a land portion defined by the adjacent grooves and coupling the side walls of the ridge stripe and the gratings.

4. A semiconductor laser according to claim 1, wherein said active layer is a bulk layer, a single quantum well layer, or a multiple quantum well layer mainly composed of $In_{1-x}Ga_xAS_{1-y}P_y$ (where $0 \leq x<1, 0 \leq y<1$); and said cladding layer is made of InP.

5. A semiconductor laser according to claim 4, wherein said contact layer is made of InGaAsP or InGaAs.

6. A semiconductor laser according to claim 1, wherein the ridge stripe and the pair of gratings have a relationship between a waveguide without grating underneath and gratings laterally coupled thereto.

7. A semiconductor laser according to claim 1, wherein the first insulator is formed to have a substantially uniform thickness to make the metal layer conformable to the grooves of gratings.

8. A semiconductor laser according to claim 2, further comprising bracket grating portions each having a slope surface extending from a flat top portion of the ridge stripe to a top face of a land portion located adjacent to members of said plurality of grooves and coupling the side walls of the ridge stripe and the gratings.

9. A semiconductor laser according to claim 2, wherein said active layer is a bulk layer, a single quantum well layer, or a multiple quantum well layer mainly composed of $In_{1-x}Ga_xAS_{1-y}P_y$ (where $0 \leq x<1, 0 \leq y \leq 1$); and said cladding layer is made of InP.

10. A semiconductor laser according to claim 9, wherein said contact layer is made of InGaAsP or InGaAs.

11. A semiconductor laser according to claim 2, wherein the ridge stripe and the pair of gratings have a relationship between a waveguide without grating underneath and gratings laterally coupled thereto.

* * * * *

UNITED STATES PATENT AND TRADEMARK OFFICE
CERTIFICATE OF CORRECTION

PATENT NO. : 6,714,571 B2
DATED : March 30, 2004
INVENTOR(S) : Watanabe et al.

It is certified that error appears in the above-identified patent and that said Letters Patent is hereby corrected as shown below:

Column 6,
Line 45, replace "both surfaces of the grooves of" with -- the surface of the grooves of both --
Line 48, between "kept" and "contact" please insert -- in direct --
Lines 63-64, replace "both surfaces of the grooves of gratings" with -- the surface of the grooves of both gratings --

Column 7,
Lines 15-16, replace "have a relationship between" with -- relate as --
Line 20, replace "comformable" with -- conformal --

Column 8,
Lines 17-18, replace "have a relationship between" with -- relate as --

Signed and Sealed this

Twenty-third Day of November, 2004

JON W. DUDAS
*Director of the United States Patent and Trademark Office*